SEMI-CONDUCTOR SIGNAL TRANSLATING DEVICE

Filed April 16, 1954

ROBERT G. POHL
*INVENTOR.*

BY Francis W. Crotty

HIS ATTORNEY.

United States Patent Office 2,838,434

Patented June 10, 1958

2,838,434

SEMI-CONDUCTOR SIGNAL TRANSLATING DEVICE

Robert G. Pohl, Chicago, Ill., assignor to The Rauland Corporation, a corporation of Illinois Application April 16, 1954, Serial No. 423,608

5 Claims. (Cl. 148—33)

This invention pertains to new and improved electrical signal-translating devices of the semi-conductor type; more specifically, the invention is directed to a new and improved diffused junction transistor.

Semi-conductor devices may be employed for a wide variety of purposes in electrical networks; for example, devices of this type may be utilized as rectifiers, detectors, amplifiers, etc. In many of these devices, it is desirable to employ a composite structure including adjacent semi-conductor layers which exhibit different types of conductivity. In one form of semi-conductor material, conductivity is considered to result from the migration or movement of positive charges or "holes"; this type of semi-conductor is generally referred to as exhibiting p-type conductivity. The other general form of semi-conductor is normally referred to as an n-type semi-conductive material and conducts electrical currents by means of the movement or migration of negative charges or electrons. A composite structure including adjacent recrystallized layers of both types of semi-conductive material is usually known as an alloy or diffused junction-type semi-conductor element and may be referred to as a junction transistor.

Several different techniques have been evolved for the manufacture of junction-type semi-conductor devices. For example, it is possible to form a solution of germanium of one conductivity type and to initiate crystallization of a semi-conductor element from that solution thereafter changing the composition of the solution during the crystallization process so that a portion of the crystallized material is of the opposite conductivity type. A more practical method for manufacturing junction transistors or similar devices comprises a diffusion or alloying process. In accordance with this process, if it is desired to form a p-type junction layer upon the surface of an n-type semi-conductor such as germanium, a so-called "acceptor" element such as indium or gallium is placed upon the surface of the n-type semi-conductor material. The semi-conductor and acceptor assemblage is then placed in a mold in an inert gas atmosphere and is heated to a temperature below the melting temperature of the semi-conductor material but substantially higher than the melting point of the acceptor, so that the acceptor element is melted and forms a p-type surface layer by alloying and diffusing into the crystalline lattice of the germanium. The same process may be applied to the formation of n-type layers upon the surface of a p-type semi-conductor material by utilizing a "donor" element such as antimony.

In n-p-n or p-n-p transistors manufactured in accordance with the above described technique, the two junction layers must be located on opposite sides of the basic semi-conductor material and should be positioned exactly opposite each other. The thickness of the base material separating the two junction layers is quite critical, since the frequency characteristics of the transistor are functionally related to the thickness of the basic semi-conductor material at this point; as the thickness of the semi-conductor material separating the two junction layers is decreased, the useful frequency range of the device increases. Consequently, diffused-junction transistors made in accordance with known techinques employ a flat wafer of single crystal germanium approximately 0.006 inch or less in thickness; this thin flat wafer is usually obtained by etching or by a combination of etching and lapping from a wafer of the order of 0.025 inch thick. These very thin semi-conductor wafers are very weak mechanically and must be handled with a vacuum chuck. With even the most careful handling, a relatively high percentage of the semi-conductor wafers are damaged in the course of manufacturing stages occurring before, during and after formation of the junction layers, which results in a substantial economic loss. An additional disadvantage of known types of diffused junction transistors is caused by the low mass of the semi-conductor wafer, which has a low heat capacity and consequently limits the power-handling capacity of the device. In addition, the small cross-sectional area of the semi-conductor material surrounding the junction region results in a high base resistance, which is undesirable for many applications.

It is an object of the invention, therefore, to provide a new and improved form of electrical signal-translating device which overcomes or minimizes the above-noted disadvantages of known types of diffused junction transistors.

It is another object of the invention to provide a new and improved diffused-junction transistor which is mechanically strong and which is capable of translating relatively large amounts of power at high frequencies.

It is an additional object of the invention to provide a new and improved diffused junction transistor which may be manufactured by means of simple, readily available processing equipment.

An electrical signal-translating device constructed in accordance with the invention comprises a wafer of semi-conductive material of predetermined conductivity type and having a predetermined thickness. This semi-conductor wafer is provided with an aperture which extends through the thickness of the wafer to form a bridge section having opposing surfaces spaced from each other by a width substantially smaller than the wafer thickness. A first diffused junction layer of material of a conductivity type different from that of the wafer material is disposed on one of these two bridge section surfaces, and a second diffused junction layer of material, also of a conductivity type different from that of the wafer material, is disposed on the opposite one of the bridge section surfaces.

The features of the invention which are believed to be novel are set forth with particularity in the appended claims. The organization and manner of operation of the invention, together with further objects and advantages thereof, may best be understood by reference to the following description taken in conjunction with the accompanying drawings, in which like reference numerals refer to like elements in the several figures, and in which:

Figure 1:
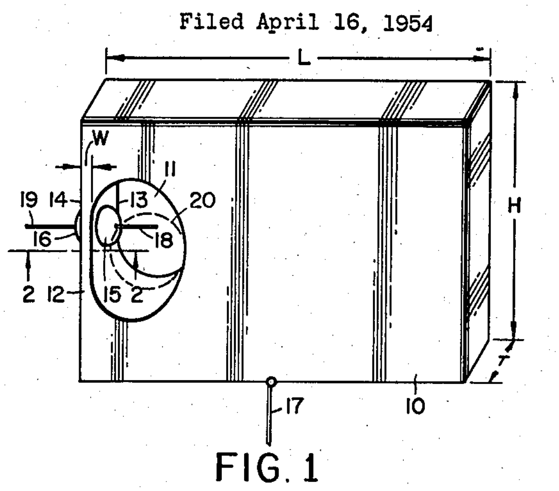
Figure 1 is an oblique view of an electrical signal-translating device constructed in accordance with the invention.

The electrical signal-translating device illustrated in Figure 1 may be generally characterized as a diffused-junction transistor and comprises a wafer 10 of semi-conductive material having a length L, height H, and thickness T. Wafer 10 may be formed from any suitable semi-conductive material such as crystalline germanium or silicon of either conductivity type. Base 10 is provided with an aperture 11 extending through the base to form a bridge section 12 which has two substantially parallel opposed surfaces 13 and 14. Bridge section surfaces 13 and 14 are spaced from each other by a width W which is substantially smaller than thickness T.

A first diffusion-type junction, generally indicated by numeral 15, is disposed on bridge section surface 13 and a second junction 16 is disposed on surface 14 directly opposite layer 15. Suitable electrical leads 17, 18, and 19 are connected to wafer 10 and to junction layers 15 and 16 respectively to permit incorporation of the device in an electrical circuit.

The advantages of the transistor construction illustrated in Figure 1 may perhaps best be understood by considering a typical manufacturing procedure which may be employed to construct the device. First, wafer 10 is cut from a single germanium crystal by means of a diamond saw; the original thickness of the semi-conductor wafer may be of the order of 0.030 inch. Length L and height H are by no means critical and may, for example, be of the order of 0.3 and 0.2 inch respectively. A hole is then drilled in wafer 10 approximately in the position indicated by dash outline 20; for this purpose, a diamond dust drill of approximately 0.06 inch diameter may be employed. A thin piece of silicone rubber may be advantageously placed below wafer 10 during the drilling process to prevent cracking of the wafer due to the pressure of the drill. Subsequently, the wafer may be pressed against the side of the rotating drill to enlarge the aperture to the approximate configuration indicated by aperture 11, with the surfaces 13 (on which diffused-junction layers 15 are to be formed) substantially flat and parallel to external surface 14, and to reduce width W of bridge section 12 to approximately 0.005 inch. Width W may be further reduced, if desired, by any of the known suitable etching processes without substantially affecting the mechanical strength of the overall structure, since the remainder of base wafer 10 remains relatively large in size.

After aperture 11 has been formed in wafer 10, cylindrical pellets of a suitable modifier element (a donor or an acceptor, depending upon the type of material from which wafer 10 is constructed) are placed on opposite sides of bridge section 12 in the positions indicated for junctions 15 and 16. These pellets, may, for example, be approximately 0.015 inch thick and approximately 0.020 inch in diameter. The entire assemblage may then be heated sufficiently to melt the modifier pellets and cause them to diffuse into the semi-conductor material of bridge section 12 to form junction layers in accordance with techniques well known in the art.

Figure 2:
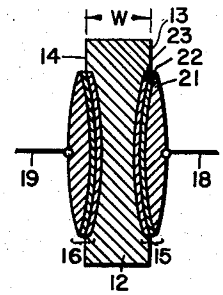
Figure 2 is an enlarged cross-sectional view of a portion of the device of Figure 1 taken along line 2—2 therein.

The internal structure of bridge section 12 and junctions 15 and 16 is illustrated in the cross-sectional view of Figure 2. For a wafer of n-type semi-conductive material, the pellets employed to form the junction layers may comprise an acceptor element such as indium. After the alloying process has been completed, a portion 21 of the indium pellet remains generally unchanged in form and may be employed to provide an electrical connection to lead 18. A further portion of the indium is alloyed with the germanium of bridge section 12, forming a layer 22 of recrystallized germanium having a high concentration of indium; layer 22 is conductive in nature. A third and relatively thin junction layer 23 is formed between layer 22 and bridge section 12. Junction layer 23 comprises germanium which is not alloyed with the indium and hence not recrystallized; however, indium atoms have migrated into layer 23, mostly by diffusion, so that the junction layer exhibits p-type conductivity as compared to the n-type conductivity of the semi-conductor material of bridge section 12. It should be understood that this description of the successive layers formed during the alloying process is an oversimplified theoretical one; there may be no sharply defined and precisely indentifiable layers in the actual junction structure.

Other suitable acceptor elements, such as gallium, may be employed to form junctions 15 and 16 where base wafer 10 is made from n-type crystalline germanium or silicon. Similarly, any suitable donor element such as antimony may be utilized to form the junctions on p-type germanium or silicon bases. Leads 17, 18 and 19 may be connected to the device of any suitable means such as by soldering; the location of the connection for lead 17 is not critical and may be made at any convenient point on base wafer 10.

The length of time required to form aperture 11 and to reduce width W to the proper size is of the order of minutes and may be accomplished much more rapidly than the etching and lapping processes required in the manufacture of conventional diffused-junction transistors. Because most of the wafer remains much thicker than the thin bridge section, the device is mechanically much stronger than the conventional type. Furthermore, width W may be accurately measured quite easily, as by a calibrated microscope, whereas accurate measurement of the extremely thin and flexible conventional wafers and the dial gauge usually employed for this purpose may easily fracture the wafer.

Figure 3:
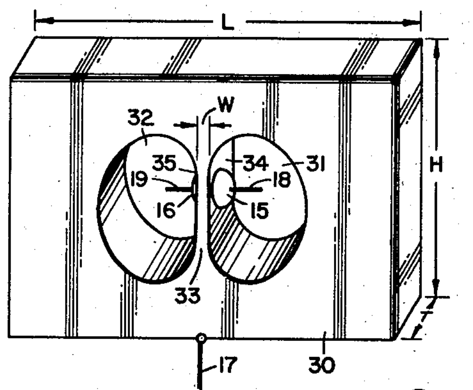
Figure 3 is an oblique view of another embodiment of the invention.

The embodiment of the invention illustrated in Figure 3 is in most respects substantially similar to that of Figure 1 and includes a base wafer 30 of semi-conductive material which may have the same general dimensions L, H and T as wafer 10 of Figure 1. In this embodiment, two separate apertures 31 and 32 are formed in wafer 30; apertures 31 and 32 define a bridge section 33 having opposed surfaces 34 and 35 which are separated by width W substantially smaller than the wafer thickness T. As in the previous embodiment, junctions 15 and 16 are disposed on flat parallel surfaces 34 and 35 directly opposite each other. Suitable leads 17, 18 and 19 are, as before, connected to the base wafer and to junctions 15 and 16 respectively.

Electrically, the embodiment of the invention illustrated in Figure 3 is identical with that of Figure 1. It does, however, offer some advantages as compared to the first described device in that the two junctions are both completely protected so that they cannot be scraped from the base wafer during subsequent handling of the device. Moreover, the most fragile portion of the element (bridge section 12) is protected from direct access in the course of normal handling, with the result that loss through breakage is reduced to a practical minimum. The additional time required to form apertures 31 and 32, as compared to that required to form the single aperture 11 of Figure 1, is offset by the fact that the crystalline material is not usually of particularly regular shape and it may often be necessary to machine surface 14 to provide a substantially flat surface.

While particular embodiments of the present invention have been shown and described, it is apparent that changes and modifications may be made without departing from the invention in its broader aspects. The aim of the appended claims, therefore, is to cover all such changes and modifications as fall within the true spirit and scope of the invention.

I claim:

1. An electrical signal-translating device comprising: a wafer, of predetermined-conductivity-type semi-conductive material of predetermined thickness, having an aperture extending entirely therethrough in the thickness direction and entirely bounded transversely of said thickness direction by said wafer material with the material between a boundary surface of said aperture and an opposed surface of said wafer constituting a bridge section of a width smaller than the thickness of said wafer; a first diffused junction layer of material of a conductivity type different from said wafer material disposed on one of said surfaces of said bridge section; and a second diffused junction layer of material of a conductivity type different from said wafer disposed on the opposite one of said bridge section surfaces.

2. An electrical signal-translating device comprising: a wafer, of predetermined-conductivity-type single-crystal semi-conductive material of predetermined thickness, having a pair of apertures extending entirely therethrough in the thickness direction and each entirely bounded transversely of said thickness direction by said wafer material with the material between opposing boundary surfaces of said apertures constituting a bridge section of a width smaller than the thickness of said wafer; a first diffused junction layer of material of a conductivity type different from that of said wafer material disposed on one of said surfaces of said bridge section; and a second diffused junction layer of material of a conductivity type different from that of said wafer material disposed on the remaining one of said bridge section surfaces directly opposite said first junction layer.

3. An electrical signal-translating device comprising: a wafer, of predetermined-conductivity-type single-crystal semi-conductive material of predetermined thickness, having an aperture extending entirely therethrough in the thickness direction and entirely bounded transversely of said thickness direction by said wafer material with the material between a boundary surface of said aperture and one edge surface of said wafer constituting a bridge section of a width smaller than the thickness of said wafer; a first diffused junction layer of material of a conductivity type different from that of said wafer material disposed on one of said surfaces of said bridge section; and a second diffused junction layer of material of a conductivity type different from that of said wafer material disposed on the remaining one of said bridge section surfaces directly opposite said first junction layer.

4. An electrical signal-translating device comprising: a wafer of single-crystal p-type semi-conductive material, said wafer having a predetermined thickness and having an aperture extending entirely therethrough in the thickness direction and entirely bounded transversely of said thickness direction by said wafer material with the material between a boundary surface of said aperture and a substantially parallel opposed surface of said wafer constituting a bridge section of a width smaller than said thickness; a first junction, comprising a donor element diffused into said semi-conductive material to form a layer of n-type material, disposed on one of said surfaces of said bridge section; and a second junction, comprising a donor element diffused into said semi-conductive material to form a layer of n-type material, disposed on the remaining one of said bridge section surfaces.

5. An electrical signal-translating device comprising: a wafer of single-crystal n-type semi-conductive material, said wafer having a predetermined thickness and having an aperture extending entirely therethrough in the thickness direction and entirely bounded transversely of said thickness direction by said wafer material with the material between a boundary surface of said aperture and a substantially parallel opposed surface of said wafer constituting a bridge section of a width smaller than said thickness; a first junction, comprising an acceptor element diffused into said semi-conductive material to form a layer of p-type material, disposed on one of said surfaces of said bridge section; and a second junction, comprising an acceptor element diffused into said semi-conductive material to form a layer of p-type material, disposed on the remaining one of said bridge section surfaces.

References Cited in the file of this patent

Proceedings of the I R E, vol. 42, No. 2, February 1954, pages 386–391. Article by Mueller, 317–239.